United States Patent
Shibuki

(10) Patent No.: US 6,749,486 B2
(45) Date of Patent: Jun. 15, 2004

(54) CHEMICAL-MECHANICAL POLISHING DEVICE, DAMASCENE WIRING FORMING DEVICE, AND DAMASCENE WIRING FORMING METHOD

(75) Inventor: Shunichi Shibuki, Isehara (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 10/204,707

(22) PCT Filed: Feb. 26, 2001

(86) PCT No.: PCT/JP01/01414
§ 371 (c)(1),
(2), (4) Date: Dec. 30, 2002

(87) PCT Pub. No.: WO01/63655
PCT Pub. Date: Aug. 30, 2001

(65) Prior Publication Data
US 2003/0166380 A1 Sep. 4, 2003

(30) Foreign Application Priority Data
Feb. 24, 2000 (JP) ..................................... 2000-047140

(51) Int. Cl.[7] .............................................. B24B 1/00
(52) U.S. Cl. ........................... 451/41; 451/288; 451/533
(58) Field of Search ............................. 451/36, 41, 59, 451/63, 285, 287–289, 290, 533, 534, 537, 550; 51/297, 298, 299

(56) References Cited

U.S. PATENT DOCUMENTS

| | | | | |
|---|---|---|---|---|
| 5,876,269 A | * | 3/1999 | Torii | 451/41 |
| 6,074,287 A | | 6/2000 | Miyaji et al. | |
| 6,077,153 A | * | 6/2000 | Fujita et al. | 451/259 |
| 6,089,960 A | * | 7/2000 | Messer | 451/285 |
| 6,123,609 A | * | 9/2000 | Satou | 451/285 |

FOREIGN PATENT DOCUMENTS

| | | |
|---|---|---|
| JP | 7-142432 | 6/1995 |
| JP | 7-266219 | 10/1995 |
| JP | 7-297195 | 11/1995 |
| JP | 9-260318 | 10/1997 |
| JP | 9-321001 | 12/1997 |
| JP | 10-34525 | 2/1998 |
| JP | 10-44026 | 2/1998 |
| JP | 10-138123 | 5/1998 |
| JP | 2000-246623 | 9/2000 |

* cited by examiner

*Primary Examiner*—Joseph J. Hail, III
*Assistant Examiner*—David B. Thomas
(74) *Attorney, Agent, or Firm*—Finnegan, Henderson, Farabow, Garrett & Dunner, LLP

(57) ABSTRACT

In a chemical mechanical polishing apparatus in accordance with the present invention, a material having a hardness defined by JIS standard K6301 (A type) of 10–40 and a thickness of 5–30 mm is used as an elastic member (16) arranged between a polishing pad (12) and a platen (36). Therefore, both flatness and uniformity of a wafer can be sufficiently improved.

7 Claims, 7 Drawing Sheets

CHEMICAL-MECHANICAL POLISHING DEVICE, DAMASCENE WIRING FORMING DEVICE, AND DAMASCENE WIRING FORMING METHOD

TECHNICAL FIELD

The present invention relates to a polishing apparatus and a polishing method in which a metal film surface formed on a semiconductor substrate is polished by a chemical mechanical approach.

BACKGROUND ART

A planarizaion process of a wafer (semiconductor substrate) in a manufacturing process is important to attain a higher integration of a semiconductor device. A CMP (Chemical Mechanical Polishing) apparatus is widely used as an apparatus planarizing a wafer. In a CMP apparatus, for example, while polishing slurry is supplied to a wafer to be polished, a metal film and the like on the wafer are polished by contact with a polishing pad.

Now, in order to selectively polish protruding portions (improve flatness) of an insulating film, a metal film and the like on a wafer, deformation of a polishing pad surface needs to be suppressed and a high hardness of the polishing pad is required. On the other hand, in order to perform uniform polishing on the entire semiconductor wafer (improve uniformity), flexibility sufficient to conform warp of the wafer is required for the polishing pad. Therefore, since there is a trade-off between flatness and uniformity in selecting a polishing pad, it is difficult to ensure both flatness and uniformity of polishing. Thus, for the purpose of improving both flatness and uniformity of the wafer, such a polishing pad is employed that has a two-layer structure formed with a hard material arranged in an upper layer in contact with the wafer to be polished and a soft material arranged in a lower layer thereof.

A wafer holding (fixing) method will now be described. Generally, in a CMP apparatus, a wafer is held using a vacuum chuck (vacuum suction), a backing film (backing pad) and the like. Advantages of using a vacuum chuck include: easiness of wafer replacement (attachment and removal); secure and firm holding of wafer; and elimination of wafer warp. As a disadvantage, the use of the aforementioned polishing pad having the two-layer structure described above cannot accommodate macroscopic thickness variations of the wafer, resulting in a poor polishing uniformity.

On the other hand, although the use of a backing pad is inferior in easiness of wafer attachment and removal and secure holding of wafer, it has an advantage in that wafer warp, thickness variations and the like can be accommodated (reduced) to some extent as the backing pad itself has a good elasticity. As a result, macroscopic undulations of the wafer can be reduced to some extent and poorer polishing uniformity can be prevented to some extent. Therefore, holding a wafer using a backing pad is presently common. A polishing apparatus using a backing pad as wafer holding means and using a polishing pad having the aforementioned two-layer structure (hard material and soft material) is disclosed for example in Japanese Patent Laying-Open Nos. 10-138123, 9-321001, 9-260318, 7-266219 and 7-297195.

The present situation of the conventional polishing method has been described above. In conclusion, the conventional CMP apparatus cannot improve both flatness and uniformity in a wafer sufficiently. This problem is outstanding particularly in case of polishing a damascene structure.

DISCLOSURE OF THE INVENTION

The present invention is made in view of the situation described above. A first object of the present invention is to provide a chemical mechanical polishing apparatus capable of sufficiently improving both flatness and uniformity of polishing even with a vacuum chuck excellent in easiness of wafer attachment and removal and secure holding of a wafer.

A second object of the present invention is to provide a damascene interconnection forming apparatus and method in which an accurate damascene interconnection can be formed by using a polishing apparatus realizing good flatness and uniformity.

In order to achieve the above objects, a chemical mechanical polishing apparatus in accordance with the present invention is applied to an apparatus including: a substrate holding table holding a semiconductor substrate by vacuum suction; a polishing pad being in contact with the semiconductor substrate; a platen holding the polishing pad; and an elastic member arranged between the polishing pad and the platen. It is characterized in that a material having a hardness defined by JIS standard K6301 (A type) of 10–40 and a thickness of 5–30 mm is used as the elastic member.

A damascene interconnection forming apparatus in accordance with the present invention is applied to a damascene interconnection forming apparatus forming an insulating film on a semiconductor substrate, forming a recessed portion in a prescribed region of the insulating film, forming a barrier metal film on a surface of the insulating film including the recessed portion, and forming a metal interconnection film on the barrier metal film to completely fill in at least the recessed portion, followed by polishing the metal film and the barrier metal film until the insulating film is exposed in a region other than the recessed portion. It is characterized by including: first polishing means for performing a first polishing step of polishing the metal interconnection film until the barrier metal film is exposed in the region other than the recessed portion; and second polishing means for performing a second polishing step of polishing the barrier metal film until the insulating film is exposed in the region other than the recessed portion. Furthermore, the first polishing means includes: a substrate holding table holding the semiconductor substrate by vacuum suction; a polishing pad being in contact with the semiconductor substrate; a platen holding the polishing pad; and an elastic member arranged between the polishing pad and the platen and having a hardness defined by JIS standard K6301 (A type) of 10–40 and a thickness of 5–30 mm. In addition, the second polishing means includes: a substrate holding table holding the semiconductor substrate by vacuum suction; a polishing pad being in contact with the semiconductor substrate; a platen holding the polishing pad; and an elastic member arranged between the polishing pad and the platen and having a hardness defined by JIS standard K6301 (A type) of at least 50.

A damascene interconnection forming method in accordance with the present invention is applied to a damascene interconnection forming method of forming an insulating film on a semiconductor substrate, forming a recessed portion in a prescribed region of the insulating film, forming a barrier metal film on a surface of the insulating film including the recessed portion, and forming a metal interconnection film on the barrier metal film to completely fill in at least the recessed portion, followed by polishing the metal film and the barrier metal film until the insulating film is exposed in a region other than the recessed portion. It is characterized by including: a first polishing step of polishing the metal interconnection film until the barrier metal film is exposed in the region other than the recessed portion using first polishing means; and a second polishing step of polishing the barrier metal film until the insulating film is exposed in the region other than the recessed portion using second polishing means. Furthermore, the first polishing means includes: a substrate holding table holding the semiconductor substrate by vacuum suction; a polishing pad being in contact with the semiconductor substrate; a platen holding the polishing pad; and an elastic member arranged between the polishing pad and the platen and having a hardness defined by JIS standard K6301 (A type) of 10–40 and a thickness of 5–30 mm. In addition, the second polishing means includes: a substrate holding table holding the semiconductor substrate by vacuum suction; a polishing pad being in contact with the semiconductor substrate; a platen holding the polishing pad; and an elastic member arranged between the polishing pad and the platen and having a hardness defined by JIS standard K6301 (A type) of at least 50.

In the damascene interconnection forming apparatus and method described above, preferably, the first polishing means and the second polishing means are implemented by a single chemical mechanical polishing apparatus. More specifically, the polishing apparatus includes: a substrate holding table holding the semiconductor substrate by vacuum suction; first and second platens arranged in positions opposing the substrate holding table in a polishing operation; a first polishing pad arranged on the first platen; a second polishing pad arranged on the second platen; a first elastic member arranged between the first platen and the first polishing pad and having a hardness defined by JIS standard K6301 (A type) of 10–40 and a thickness of 5–30 mm; and a second elastic member arranged between the second platen and the second polishing pad and having a hardness defined by JIS standard K6301 (A type) of at least 50. In performing the first polishing step, the substrate holding table is arranged in a position opposing the first platen, and in performing the second polishing step, the substrate holding table is arranged in a position opposing the second platen.

BRIEF DESCRIPTION OF THE DRAWINGS

FIGS. 3A to 3C are cross sectional views showing the steps of a damascene interconnection forming method in accordance with the present invention, in which FIG. 3A is a state before polishing, FIG. 3B is a state after a first polishing step and FIG. 3C is a state after a second polishing step.

BEST MODES FOR CARRYING OUT THE INVENTION

The present invention is applied to a case where a metal interconnection layer having a narrow width (less than 200 $\mu$m) of a recessed portion is polished, in a type of CMP apparatus in which a wafer is basically fixed by a vacuum chuck.

Figure 1:
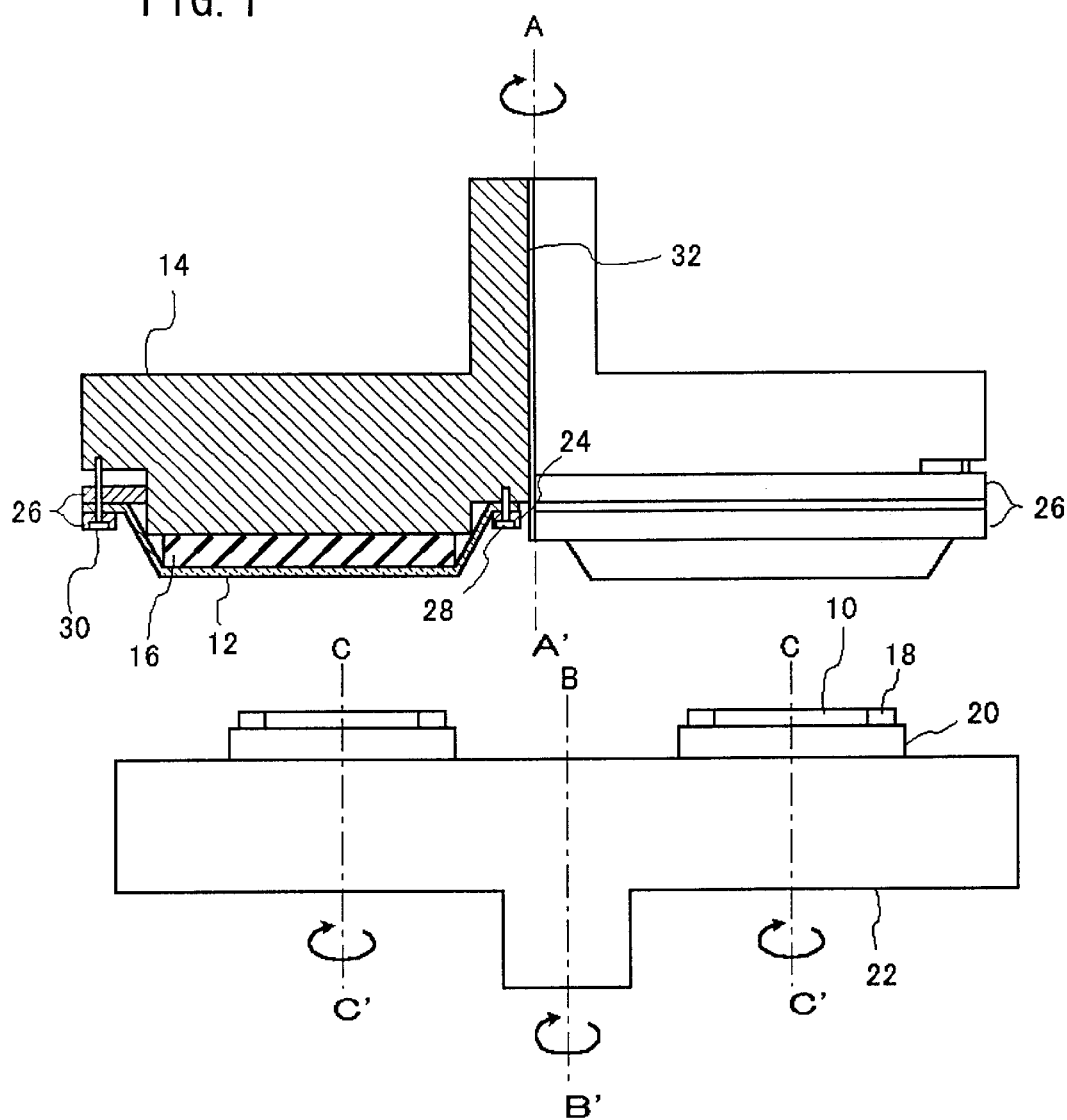
FIG. 1 is a side view (with a partial cross section) showing a configuration of a CMP apparatus in accordance with the present invention with a polishing pad fixed by a mounting technique.

FIG. 1 shows a configuration of a CMP apparatus according to a first embodiment of the present invention. This CMP apparatus includes a polishing pad 12 in contact with a wafer 10 to be polished, a platen 14 with polishing pad 12 attached thereto, an elastic member 16 arranged between polishing pad 12 and platen 14, a wafer stage 20 holding wafer 10, a retainer 18 fixed on wafer stage 20, and a wafer turn table 22 rotatably supporting wafer stage 20. The main feature of the present invention is in a setting of hardness and thickness of elastic member 16. It is noted that a specific setting value of elastic member 16 will be described later.

Elastic member 16 is formed like a ring (doughnut-shaped) having a hole at the center thereof and fixed on platen 14 by a double-faced tape and the like. Elastic member 16 is set on platen 14 without letting-in air therebetween. Normally, once elastic member 16 is set on platen 14, it is not frequently replaced. Polishing pad 12 is also formed like a ring (doughnut-shaped) and fixed on a bottom face of platen 14 by an inner ring 24, an outer peripheral ring 26 and bolts 28, 30.

Wafer stage 20 is provided in a rotatable manner on wafer turn table 22. Retainer 18 is fixed on wafer stage 20 and wafer 10 is fixed on wafer stage 20 by a vacuum chuck. Platen 14, wafer turn table 22 and wafer stage 20 each are rotated about axes A–A', B–B' and C–C'. At the center of platen 14, a slurry supply hole 32 is provided to extend vertically, and prescribed slurry is supplied from this slurry supply hole 32 during a polishing operation.

Polishing pad 12 is fixed on platen 14 by a so-called mounting technique. Specifically, without using adhesive and the like, it is fixed by fastening the aforementioned bolts 28 and 30 only at an outer peripheral portion and an inner peripheral portion. It is noted that in the present invention a method of fixing a polishing pad is not limited to the mounting technique and a variety of techniques including an adhesive technique (FIG. 2) and the like can be employed.

In a polishing operation, wafer 10 is fixed on wafer stage 20 by a vacuum chuck, and platen 14, wafer turn table 22 and wafer stage 20 each are driven to rotate. Thereafter, while slurry is supplied from slurry supply hole 32, platen 14 is brought down and polishing pad 12 is pressed against a polished surface of wafer 10 at a prescribed pressure for polishing.

Figure 2:
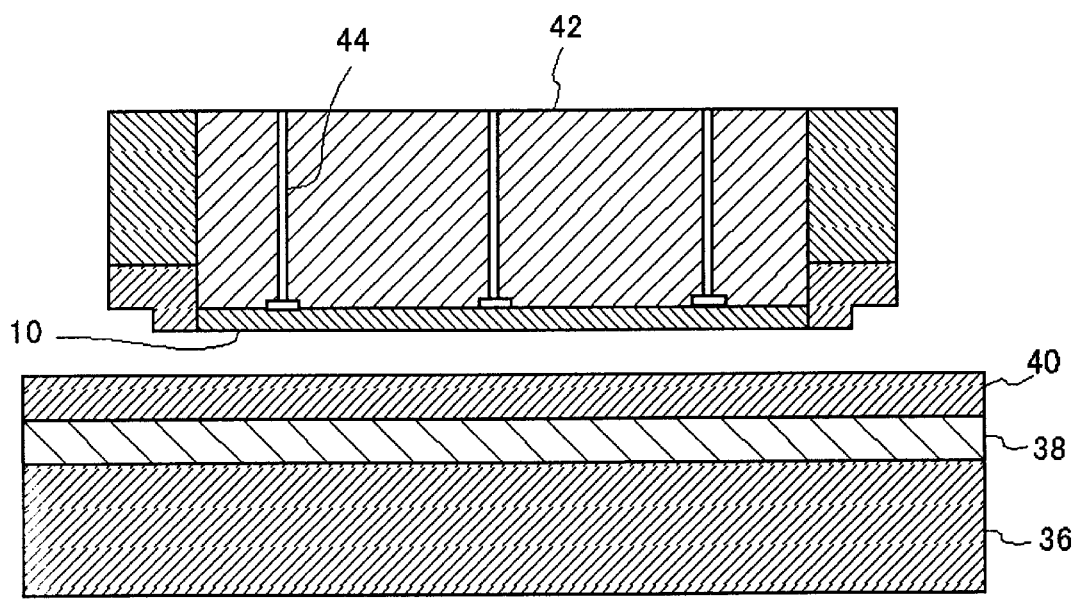
FIG. 2 is a cross sectional view showing a configuration of a main part of the CMP apparatus in accordance with the present invention with the polishing pad adhesively fixed to a platen.

FIG. 2 shows an example in which a polishing pad is adhesively fixed on a platen. In this example, an elastic member 38 is adhesively fixed on a platen 36, and a polishing pad 40 is adhesively fixed on elastic member 38. Wafer 10 is fixed on a bottom surface of wafer holding table 42 by vacuum suction. Inside wafer holding table 42, a plurality of holes 44 for evacuation are formed.

Elastic member 16, 38 in accordance with the present invention is set to have a thickness defined by JIS standard K6301 (A type) of 10–40 and a thickness of 5–30 mm. In the following, grounds for this (experimental data) will be described. It is noted that such a polishing pad can be used that has a hardness defined by JIS standard K6301 (A type) of 90 or more and a thickness of 0.5–2 mm. In the experiment below, IC 1000 manufactured by Rodel Inc. in USA (having a hardness of 95 and a thickness of about 1.3 mm) was used.

1. Evaluation for Hardness of the Elastic Member

An experiment was performed on changes of flatness and uniformity in wafer polishing with respect to the hardness of elastic member 16 or 38. The experiment was performed on a sample (wafer) shown in FIG. 3A. The wafer had a pattern by forming a thermal oxide film (insulating film) 46 having a thickness of 5000 Å on a substrate, forming a recessed portion having a width of 10 $\mu$m–5 mm and a depth of 4500 Å (to be an interconnection portion after completing polishing) in a prescribed region, forming a Ta film (barrier metal film) 48 thereon having a thickness of 200 Å, forming a Cu seed film 50 thereon having a thickness of 1000 Å, and further forming Cu plating 52 (metal interconnection film) thereon having a thickness of 1 μm. The pattern used in the experiment had a line and space of a 10 mm length with a space set at 5 mm. The lines (recessed portions) as used herein had different widths (10 μm–5 mm). The thickness of the elastic body was 10 mm. Furthermore, a polishing rate was set at a value of 6000 Å/min when an entirely flat film (mat film) of Cu was polished at a pressure of 300 g/cm².

(1) Flatness Evaluation

In a flatness evaluation, polishing (in one step) was performed until oxide film 46 in the aforementioned pattern surface was exposed, and an interconnection thickness decreasing amount (dishing) after polishing was measured in the interconnection portions having a variety of widths. The experimental results are shown in Table 1. It is noted that in the table the hardness is a value defined by JIS standard K6301 (A type) and dishing amount is expressed in Å. Furthermore, in the table, "IC1000/400" means IC1000/400 manufactured by Rodel Inc. in USA. This is a polishing pad with two-layer structure conventionally commonly used, using IC1000 (having a hardness of 95 in conformity with JIS-K6301) as a hard material of an upper layer (corresponding to the polishing pad of the present invention) and using SUBA400 (having a hardness of 55–66 in conformity with JIS-K6301) as a soft material of a lower layer (corresponding to the elastic member of the present invention).

TABLE 1

| | interconnection width | | | | | | | | |
|---|---|---|---|---|---|---|---|---|---|
| hardness | 10 μm | 20 | 50 | 100 | 200 | 500 | 1 mm | 2 mm | 5 mm |
| 5 | 200 | 400 | 800 | 1700 | 2000 | 3500 | 3800 | 4000 | 4500 |
| 10 | 50 | 100 | 100 | 300 | 600 | 1800 | 2000 | 3200 | 4500 |
| 20 | 50 | 100 | 100 | 300 | 500 | 1500 | 1700 | 1800 | 4500 |
| 40 | 50 | 100 | 100 | 300 | 500 | 1300 | 1500 | 1700 | 4500 |
| 60 | 50 | 100 | 100 | 300 | 500 | 1200 | 1300 | 1500 | 4500 |
| IC1000/400 | 50 | 100 | 100 | 300 | 400 | 1100 | 1200 | 1400 | 3500 |

As is clear from the Table 1 above, good flatness (low dishing amount) is obtained when a hardness is 10 or more. It is noted that in a case where an interconnection width (that is, a width of the recessed portion formed in insulating film 46) is 500 μm or more even with a hardness of 10 or more, flatness is deteriorated. This is not a significant problem, however, since an actual width of the metal interconnection layer is not more than 200 μm.

(2) Uniformity Evaluation

Figure 4:
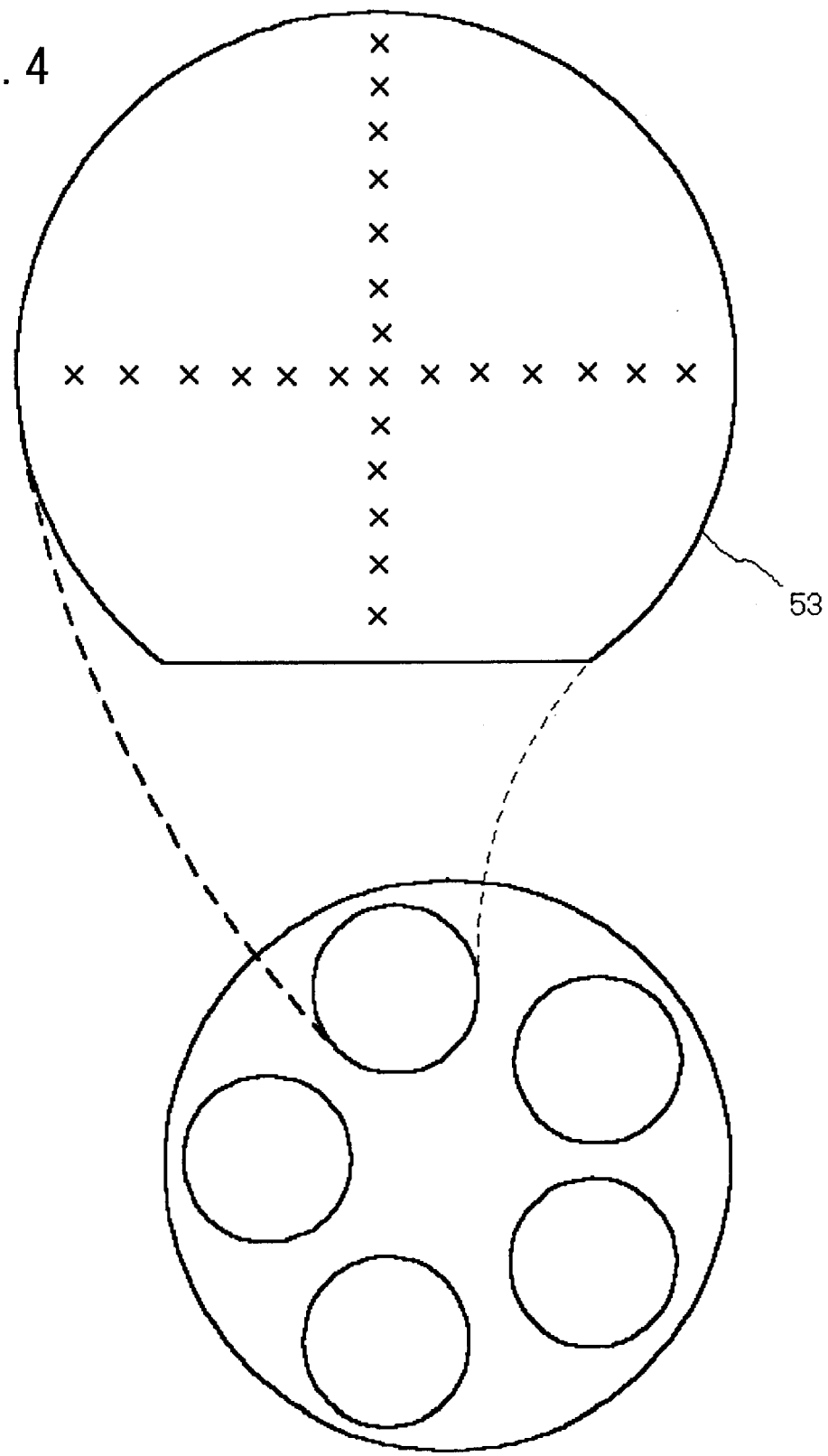
FIG. 4 is an illustration showing points for measuring within-wafer-surface-uniformity (polishing uniformity) in accordance with the present invention.

Polishing uniformity within a wafer surface was determined with elastic member 16 or 38 having a hardness defined by JIS standard K6301 (A type) between 5 and 90. As indicated by × in FIG. 4, determination of uniformity "δ" was performed by measuring a film thickness $X_i$ at twenty-five points on two straight lines intersecting through the center of wafer 53, based on the following equations.

Film thickness: $X_i (i=1–25)$

Average film thickness: $X = 1/25 \cdot \Sigma X_i$

Within-wafer-surface-uniformity: $\delta = 1/X \cdot \sqrt{(1/25 \cdot \Sigma (X-X_i)^2)} \times 100$ The experimental results are shown in Table 2.

TABLE 2

| hardness | 5 | 10 | 20 | 40 | 60 | 90 | IC 1000/400 |
|---|---|---|---|---|---|---|---|
| uniformity | 5.3 | 3.8 | 3.5 | 3.7 | 10.8 | 15.3 | 20.4 |

As is clear from the table above, good uniformity is obtained when a hardness of elastic member 16, 38 is between 5 and 40, particularly between 10 and 40.

2. Evaluation for the Thickness of the Elastic Member

An experiment was performed on changes of flatness and uniformity in wafer polishing with respect to the thickness of elastic member 16 or 38. Similar to the case of the hardness of the elastic member, the experiment was performed on a sample (wafer) shown in FIG. 3A.

(1) Flatness Evaluation

In a flatness evaluation, polishing (in one step) was performed until oxide film 46 in the aforementioned pattern surface was exposed and an interconnection thickness decreasing amount (dishing) after polishing was measured in an interconnection portion having a width of 200 μm. The experimental results are shown in Table 3 in a range of a thickness of 3 mm–60 mm and a hardness of 10–40. It is noted that in the table, the hardness is a value defined by JIS standard K6301 (A type) and a dishing amount is expressed in Å.

TABLE 3

| | thickness | | | | | | |
|---|---|---|---|---|---|---|---|
| hardness | 3 mm | 5 | 10 | 20 | 30 | 40 | 60 |
| 10 | 600 | 600 | 600 | | 600 | 900 | 1300 |
| 20 | 500 | 500 | 500 | 500 | 500 | 800 | 1100 |
| 40 | 500 | 500 | 500 | | 500 | 800 | 1000 |

As is clear from Table 3, good flatness is obtained when elastic member 16 or 38 has a thickness of not less than 3 mm and not more than 30 mm.

(2) Evaluation for Within-wafer-surface-uniformity

The experiment on a uniformity evaluation was performed in the same condition as that of the flatness described above. Specifically, polishing (in one step) was performed until oxide film 46 in the pattern surface was exposed, and uniformity after polishing in the interconnection portion having a width of 20 μm was measured. The experimental results are shown in Table 4 in a range of a thickness of 3 mm–60 mm and a hardness of 10–40. It is noted that determination of uniformity "δ" was performed by measuring film thickness $X_i$ at twenty-five points on two straight lines intersecting through the center of wafer 53 (FIG. 4), based on the following equations.

Film thickness: $X_i (i=1-25)$

Average film thickness: $X = 1/25 \cdot \Sigma X_i$

Within-wafer-surface-uniformity: $\delta = 1/X \cdot \sqrt{(1/25 \cdot \Sigma (X-X_i)^2)} \times 100$

TABLE 4

| hardness | thickness | | | | | | |
|---|---|---|---|---|---|---|---|
| | 3 mm | 5 | 10 | 20 | 30 | 40 | 60 |
| 10 | 6.8 | 4.2 | 3.8 | | 4.8 | 5.2 | 7.6 |
| 20 | 10.8 | 4.5 | 3.5 | 3.5 | 3.2 | 4.7 | 6.2 |
| 40 | 12.3 | 4.7 | 3.7 | | 3.1 | 5.3 | 7.5 |

As is clear from Table 4, good uniformity is obtained when elastic member 16 or 38 has a thickness of not less than 5 mm and not more than 30 mm.

Considering the experimental results shown in Tables 1 to 4 on the whole, good flatness and uniformity is obtained when elastic member 16 or 38 has a hardness of 10–40 (JIS standard K6301 A type) and a thickness of 5 mm–30 mm.

Next, another embodiment of the present invention will be described. In this embodiment, polishing of the damascene interconnection layer is performed in two steps. Specifically, polishing is performed until Ta film 48 is exposed in a first step and polishing is performed until oxide film 46 is exposed in a second step.

Flatness evaluation (experimental) results are shown in Table 5 in a case where the damascene interconnection layer is polished in two steps. In this experiment, in the first polishing step, elastic member 16 or 38 for use had a hardness of 10 and 20 and a thickness of 10 mm, and other conditions were similar to those in the embodiment above (the example using one step for polishing). In the second polishing step, IC1000/400 manufactured by Rodel Inc. in USA was used as the polishing pad, and the same slurry as in the first polishing step and different slurry (having a selective ratio between Cu and Ta lower than that of the first polishing step) were used. Here, IC1000/400 manufactured by Rodel Inc. in USA means that IC1000 (a hardness of 95 in compliance with JIS-K6301) is used as a hard material of an upper layer (corresponding to the polishing pad) and SUBA400 (a hardness of 55–66 in compliance with JIS-K6301) is used as a soft material of a lower layer (corresponding to the elastic member).

In a flatness evaluation, an interconnection thickness decreasing amount (dishing) after polishing in the interconnection portion having a width of 200 μm was measured. In the experiment, the hardness of the elastic member (16 or 38) for use in the first polishing step was set at 10, 20. Furthermore, data (the experimental data in one step as described above) is shown as a comparative example where polishing of the damascene interconnection layer (FIGS. 3A–3C) was performed in one step. It is noted that in Table 5, the hardness is a value defined by JIS standard K6301 (A type) and a dishing amount is expressed in Å.

TABLE 5

| | elastic body for first step | | |
|---|---|---|---|
| slurry | 10 | 20 | IC 1000/400 |
| same in first and second steps | 400 | 400 | — |
| different between first and second steps | 300 | 300 | — |
| comparative example (only first step) | 600 | 500 | 400 |

As is clear from Table 5, polishing in two steps (a first polishing step and a second polishing step) improves the flatness as compared with polishing up to the oxide film in one step. Using different slurry between a first polishing step and a second polishing step further improves the flatness.

Figure 5:
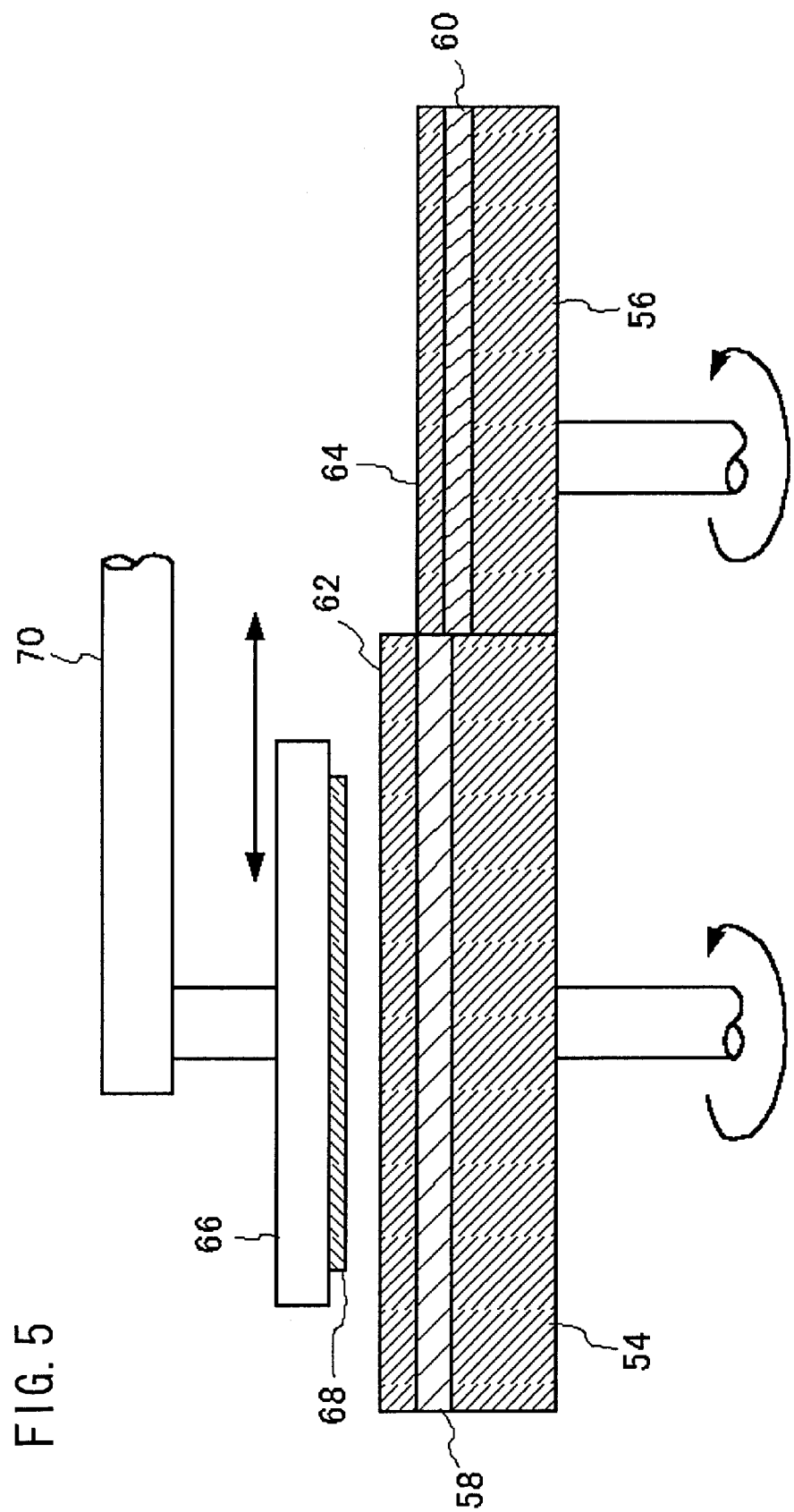
FIG. 5 is a plane view showing a configuration of a main part of a polishing apparatus (a platen and a wafer holding table) in accordance with the present invention.
Figure 6:
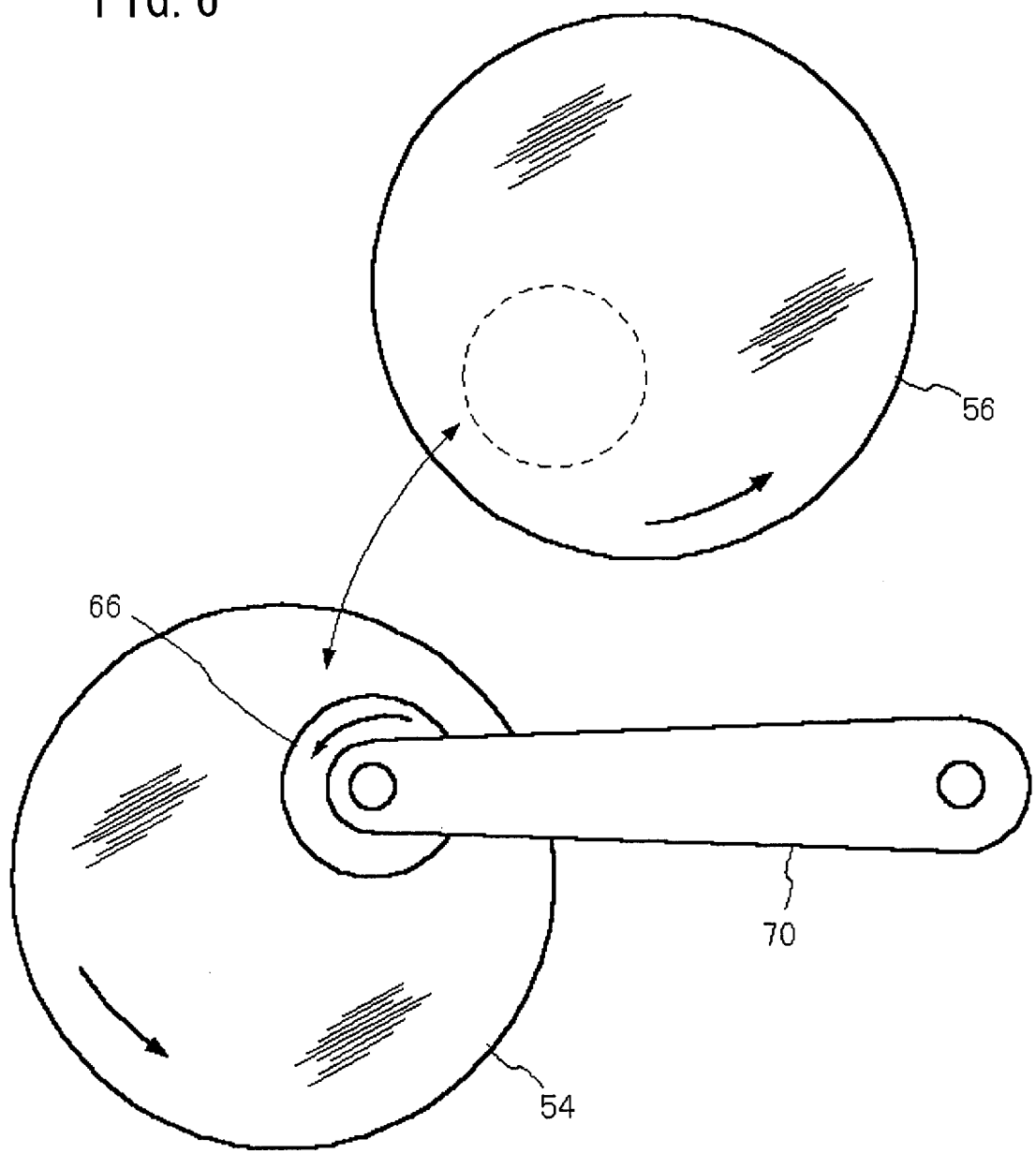
FIG. 6 is a side view of the apparatus shown in FIG. 5 with a partial cross section.

FIGS. 5 and 6 show a configuration of a main part of a CMP apparatus (a platen and a wafer holding member) used to polish a damascene interconnection layer in two steps (a first polishing step and a second polishing step). FIG. 5 is a plane view and FIG. 6 is a side view (with a partial cross section). In this embodiment, two different platens 54 and 56 are used to polish the damascene interconnection. A first platen 54 holds a first polishing pad 62. A first elastic member 58 is arranged between first platen 54 and polishing pad 62. A second platen 56 holds a second polishing pad 64. A second elastic member 60 is arranged between second platen 56 and polishing pad 64.

It is noted that for the purpose of using terms consistently, in case of a polishing pad having a two-layer structure such as IC1000/400 manufactured by Rodel Inc. in USA used in the experiment described above, an upper layer formed of a hard material being in contact with a wafer to be polished will be referred to as "polishing pad" and a lower layer formed of a soft material positioned between the upper layer and the platen will be referred to as "elastic member". Furthermore, first polishing pad 62 and second polishing pad 64 can be used each having a hardness defined by JIS standard K6301 (A type) of not less than 90 and a thickness of 0.5 mm–2 mm. For example, IC1000 manufactured by Rodel Inc. in USA can be used as polishing pad 62, 64.

The CMP apparatus shown in FIGS. 5 and 6 is provided with a single wafer holding table 66, and a wafer 68 is hold by vacuum suction. Wafer holding table 66 can be moved between a position opposing first platen 54 and a position opposing second platen 56 by a robot arm 70.

First platen 54 is used in the first polishing step (polishing until barrier metal 48 is exposed), and first elastic member 58 for use has a hardness defined by JIS standard K6301 (A type) of 10–40 and a thickness of 5–30 mm. On the other hand, second platen 56 is used in the second polishing step (polishing until oxide film 46 is exposed), and second elastic member 60 for use has a hardness defined by JIS standard K6301 (A type) of not less than 50.

Figure 3A:
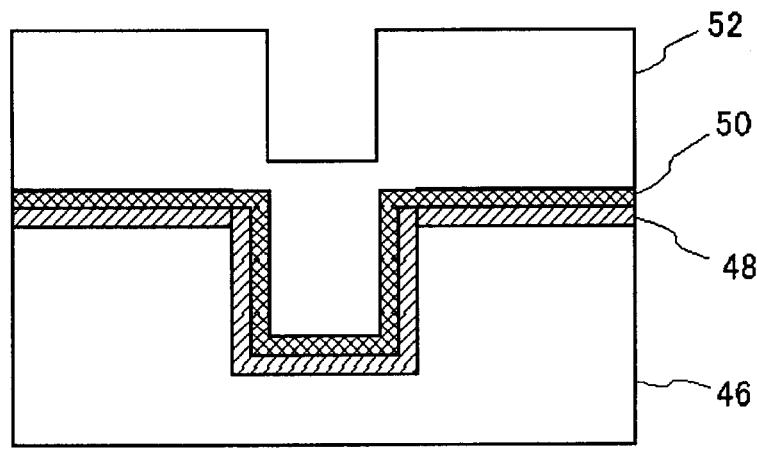
Figure 3B:
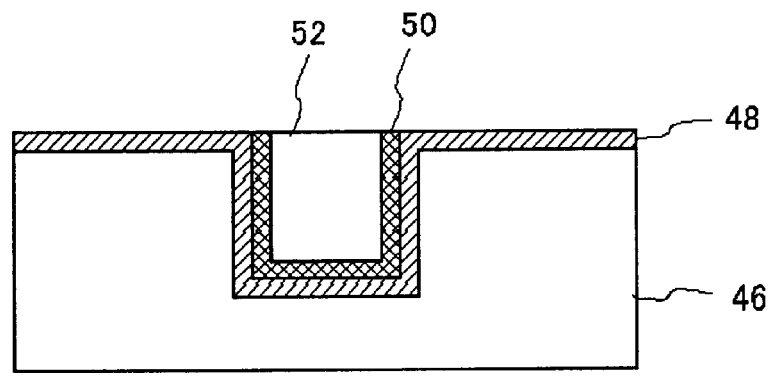
Figure 3C:
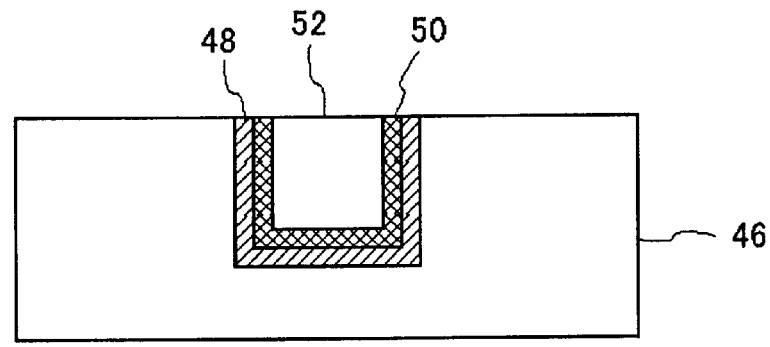

In the CMP apparatus shown in FIGS. 5 and 6, in a case where polishing is performed on the damascene interconnection structure shown in FIGS. 3A–3C, wafer holding table 66 is arranged in a position opposing (directly above) first platen 54 by operating robot arm 70, and as shown in FIG. 3B, Cu film 52 and Cu seed film 50 are polished until Ta film 48 is exposed (the first polishing step). Next, wafer holding table 66 is arranged in a position opposing (directly above) second platen 54 by operating robot arm 70, and as shown in FIG. 3C, Ta film 48 is polished until thermal oxide film pattern 46 is exposed (the second polishing step).

Figure 7:
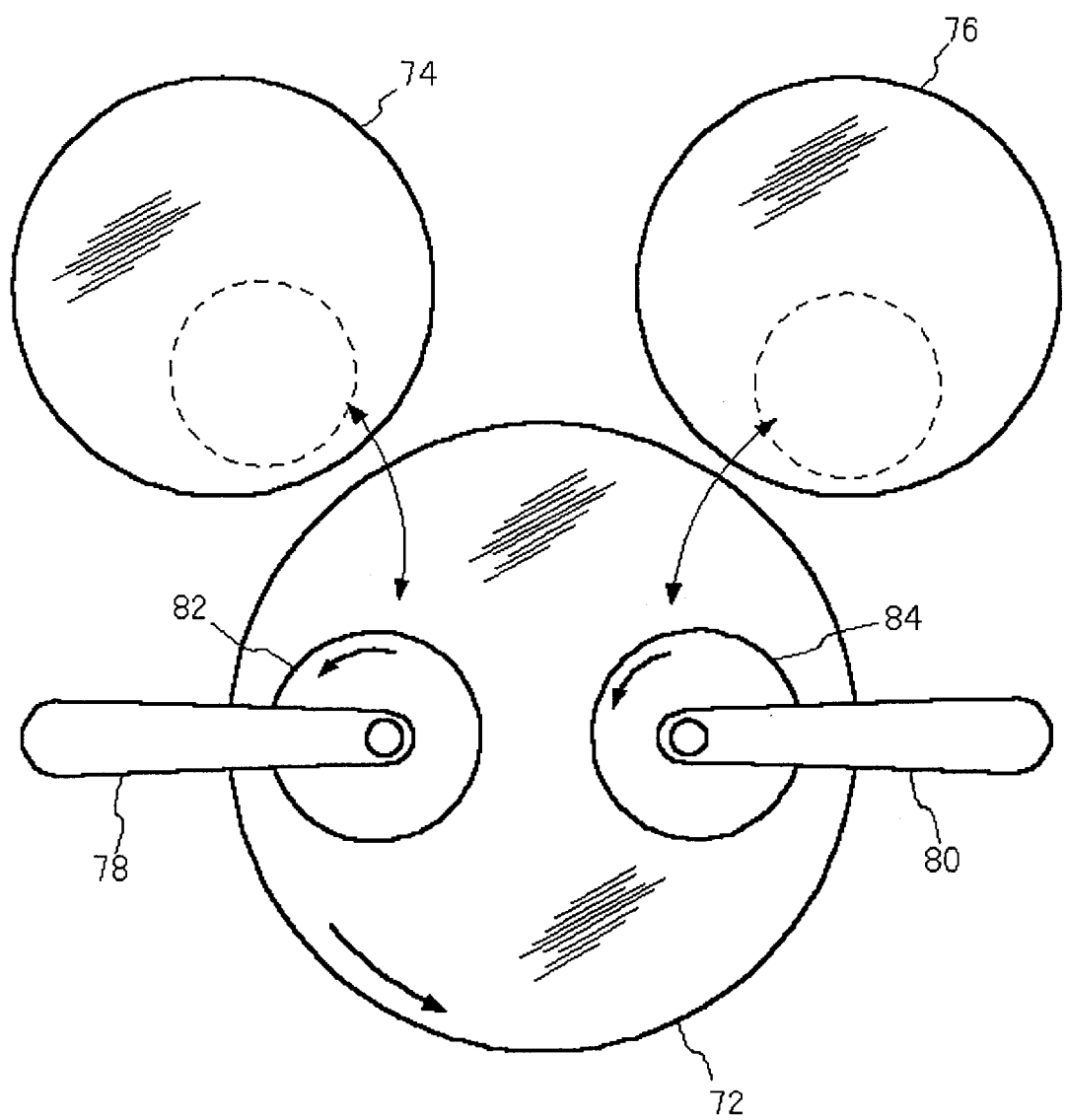
FIG. 7 is a plane view showing the configuration of the main part of another type of polishing apparatus (the platen and the wafer holding table) in accordance with the present invention.

FIG. 7 shows another example of the CMP apparatus (the platens and the wafer holding members) used to polish the damascene interconnection layer (FIGS. 3A–3C) in two steps (a first polishing step and a second polishing step). In this example, a single, first platen 72 for use in the first polishing step and two, second platens 74 and 76 for use in the second polishing step are provided to polish the damascene interconnection. First platen 72 holds first polishing pad 62 and allows two wafers to be polished at the same time. First elastic member 58 is arranged between first platen 72 and polishing pad 62. Each second platen 74, 76 has second polishing pad 64. Second elastic member 60 is arranged between second platen 74, 76 and polishing pad 64.

In the CMP apparatus shown in FIG. 7, two, second platens 74 and 76 are respectively provided with wafer holding tables 82 and 84, and the wafer is held by vacuum suction. Wafer holding table 82 can be moved between a position opposing first platen 72 and a position opposing second platen 74 by a robot arm 78. Furthermore, wafer holding table 84 can be moved between a position opposing first platen 72 and a position opposing second platen 76 by a robot arm 80.

First platen 72 is used in the first polishing step (polishing until the barrier metal is exposed) and has a structure shown in FIG. 2. Specifically, first elastic member 38 is interposed between polishing pad 40 and platen 36. Furthermore, the elastic member for use has a hardness defined by JIS standard K6301 (A type) of 10–40 and a thickness of 5–30 mm. On the other hand, second platen 74 is used in the second polishing step (polishing until the oxide film is exposed), and the second elastic member for use has a hardness defined by JIS standard K6301 (A type) of not less than 50.

In the CMP apparatus shown in FIG. 7, in a case where the damascene structure shown in FIGS. 3A–3C is polished, wafer holding tables 82 and 84 are arranged in positions opposing (directly above) first platen 72 by operating robot arms 78 and 80, and as shown in FIG. 3B, Cu film 52 and Cu seed film 50 are polished until Ta film 48 is exposed (the first polishing step). Next, wafer holding tables 82 and 84 are arranged in positions opposing (directly above) second platens 74 and 76 by operating robot arms 78 and 80, and as shown in FIG. 3C, Ta film 48 is polished until thermal oxide film pattern 46 is exposed (the second polishing step).

A method of polishing the damascene interconnection layer (FIGS. 3A–3C) in two steps (a first polishing step and a second polishing step) includes a method with a plurality of platens and the respective wafer holding tables corresponding to the platens within one CMP apparatus, in addition to the methods shown in FIGS. 5, 6 and 7. In this case, in a first polishing step, a first wafer holding table sucks and holds a wafer and polishing is performed using a polishing pad attached to a corresponding first platen. Thereafter, the wafer is transferred from the first holding table to a second holding table using a robot arm, and a second polishing step is performed using a polishing pad attached to a second platen.

Other methods include a method with CMP apparatuses separately provided to perform the first and second polishing steps. Still another method may include a method using the same CMP apparatus and the same platen for the first and second polishing steps. In this case, the first polishing step is initially performed on a prescribed number (100, etc.) of wafers. The second polishing step is thereafter performed by replacing the elastic member arranged under the polishing pad.

While the embodiments of the present invention have been described above, the present invention is not limited to these embodiments and may be changed within a scope of technical concepts illustrated in the claims.

Industrial Applicability

In accordance with the present invention, since a material having a hardness defined by JIS standard K6301 (A type) of 10–40 and a thickness of 5–30 mm is used as an elastic member, both flatness and uniformity of a wafer can effectively be improved even if the wafer is held by vacuum suction. Therefore, advantageously, an accurate damascene interconnection can be formed.

What is claimed is:

1. A chemical mechanical polishing apparatus planarizing a surface of a metal film formed on a semiconductor substrate (10), comprising:

a substrate holding table (42) holding said semiconductor substrate by vacuum suction;

a polishing pad (12) being in contact with said semiconductor substrate;

a platen (36) holding said polishing pad; and an elastic member (16) arranged between said polishing pad and said platen, wherein said elastic member has a hardness defined by JIS standard K6301 (A type) of 10–40 and a thickness of 5–30 mm.

2. A damascene interconnection forming apparatus forming an insulating film (46) on a semiconductor substrate (10), forming a recessed portion in a prescribed region of the insulating film, forming a barrier metal film (48) on a surface of the insulating film including the recessed portion, and forming a metal interconnection film (52) on said barrier metal film to completely fill in at least said recessed portion, followed by polishing said metal film and said barrier metal film until said insulating film is exposed in a region other than said recessed portion, comprising:

first polishing means for performing a first polishing step of polishing said metal interconnection film until said barrier metal film is exposed in the region other than said recessed portion; and second polishing means for performing a second polishing step of polishing said barrier metal film until said insulating film is exposed in the region other than said recessed portion, wherein said first polishing means includes a substrate holding table holding said semiconductor substrate by vacuum suction, a polishing pad being in contact with said semiconductor substrate, a platen holding said polishing pad, and an elastic member arranged between said polishing pad and said platen and having a hardness defined by JIS standard K6301 (A type) of 10–40 and a thickness of 5–30 mm, and said second polishing means includes a substrate holding table holding said semiconductor substrate by vacuum suction, a polishing pad being in contact with said semiconductor substrate, a platen holding said polishing pad, and an elastic member arranged between said polishing pad and said platen and having a hardness defined by JIS standard K6301 (A type) of at least 50.

3. The damascene interconnection forming apparatus according to claim 2, wherein said first and second polishing means are included in a single chemical mechanical polishing apparatus, the polishing apparatus includes a substrate holding table (66) holding said semiconductor substrate (10) by vacuum suction, first and second platens (54, 56) each arranged in a position opposing said substrate holding table in a polishing operation, a first polishing pad (62) arranged on said first platen (54), a second polishing pad (64) arranged on said second platen (56), a first elastic member (58) arranged between said first platen and said first polishing pad and having a hardness defined by JIS standard K6301 (A type) of 10–40 and a thickness of 5–30 mm, and a second elastic member (60) arranged between said second platen and said second polishing pad and having a hardness defined by JIS standard K6301 (A type) of at least 50, and in performing said first polishing step, polishing is performed using said first polishing pad by arranging said substrate holding table in a position opposing said first platen, and in performing said second polishing step, polishing is performed using said second polishing pad by arranging said substrate holding table in a position opposing said second platen.

4. The damascene interconnection forming apparatus according to claim 3, wherein said chemical mechanical polishing apparatus includes one said first platen (54), a plurality of said second platens, and said substrate holding tables as many as said second platens (56).

5. A damascene interconnection forming method of forming an insulating film (46) on a semiconductor substrate (10), forming a recessed portion in a prescribed region of the insulating film, forming a barrier metal film (48) on a surface of the insulating film including the recessed portion, and forming a metal interconnection film (52) on said barrier metal film to completely fill in at least said recessed portion, followed by polishing said metal film and said barrier metal film until said insulating film is exposed in a region other than said recessed portion, comprising:

a first polishing step of polishing said metal interconnection film until said barrier metal film is exposed in the region other than said recessed portion using first polishing means; and a second polishing step of polishing said barrier metal film until said insulating film is exposed in the region other than said recessed portion using second polishing means, wherein said first polishing means includes a substrate holding table (66) holding said semiconductor substrate by vacuum suction, a polishing pad (62, 64) being in contact with said semiconductor substrate, a platen (54, 56) holding said polishing pad, and an elastic member (58, 60) arranged between said polishing pad and said platen and having a hardness defined by JIS standard K6301 (A type) of 10–40 and a thickness of 5–30 mm, and said second polishing means includes a substrate holding table holding said semiconductor substrate by vacuum suction, a polishing pad being in contact with said semiconductor substrate, a platen holding said polishing pad, and an elastic member arranged between said polishing pad and said platen and having a hardness defined by JIS standard K6301 (A type) of at least 50.

6. The damascene interconnection forming method according to claim 5, wherein said first and second polishing means are included in a single chemical mechanical polishing apparatus, the polishing apparatus includes a substrate holding table (66) holding said semiconductor substrate (10) by vacuum suction, first and second platens (54, 56) each arranged in a position opposing said substrate holding table in a polishing operation, a first polishing pad (62) arranged on said first platen (54), a second polishing pad (64) arranged on said second platen (56), a first elastic member (58) arranged between said first platen and said first polishing pad and having a hardness defined by JIS standard K6301 (A type) of 10–40 and a thickness of 5–30 mm, and a second elastic member (60) arranged between said second platen and said second polishing pad and having a hardness defined by JIS standard K6301 (A type) of at least 50, and in performing said first polishing step, polishing is performed using said first polishing pad by arranging said substrate holding table in a position opposing said first platen, and in performing said second polishing step, polishing is performed using said second polishing pad by arranging said substrate holding table in a position opposing said second platen.

7. The damascene interconnection forming method according to claim 6, wherein said chemical mechanical polishing apparatus includes one said first platen (54), a plurality of said second platens, and said substrate holding tables as many as said second platens (56).

* * * * *